United States Patent [19]

Kaneko et al.

[11] Patent Number: 5,032,810
[45] Date of Patent: Jul. 16, 1991

[54] LC FILTER

[75] Inventors: Toshimi Kaneko; Masahiko Kawaguchi, both of Kyoto, Japan

[73] Assignee: Murata Manufacturing Co., Ltd., Nagaokakyo, Japan

[21] Appl. No.: 280,796

[22] Filed: Dec. 7, 1988

[30] Foreign Application Priority Data

Dec. 8, 1987 [JP] Japan .................................. 62-310440

[51] Int. Cl.⁵ ............................................. H03H 7/01
[52] U.S. Cl. .................................... 333/185; 333/175; 333/184
[58] Field of Search ............... 333/175, 185, 167, 204, 333/246; 336/200

[56] References Cited

U.S. PATENT DOCUMENTS 4,063,201 12/1977 Komatsubara et al. ......... 333/180 X
4,128,818 12/1978 Scherba ......................... 333/175 X
4,701,725 10/1987 Dorsey ............................ 333/185

FOREIGN PATENT DOCUMENTS 0190113 11/1983 Japan .................................. 333/167
0236501 11/1985 Japan .................................. 333/175
62-159510 7/1987 Japan .
62-189807 8/1987 Japan .

Primary Examiner—Eugene R. LaRoche
Assistant Examiner—Seung Ham
Attorney, Agent, or Firm—Armstrong, Nikaido, Marmelstein, Kubovcik & Murray

[57] ABSTRACT

An LC filter having electrode layers formed on opposite surfaces of a dielectric substrate. This filter includes a line electrode formed on one surface of the dielectric substrate. The line electrode extends from one electrode layer along outer edges of other electrode layers.

4 Claims, 4 Drawing Sheets

LC FILTER

BACKGROUND OF THE INVENTION (1) Field of the Invention

The present invention relates to LC filters having electrode layers formed on opposite surfaces of a dielectric substrate.

(2) Description of the Prior Art

LC filters having inductor electrode layers and capacitor electrode layers formed on a dielectric substrate are well known. In manufacturing this type of LC filter, an electrode layer arrangement is designed according to an LC circuit the layers are to constitute. When forming an LC circuit as shown in FIG. 1, for example, the electrode layers are accordingly arranged as shown in FIGS. 2 and 3.

More particularly, a capacitor C1 in FIG. 1 comprises capacitor electrode layers 2 and 3 formed on top and bottom surfaces of a dielectric substrate 1 at directly opposite positions across the substrate 1. Similarly, a capacitor C2 in FIG. 1 comprises capacitor electrode layers 4 and 5 formed at directly opposite positions across the substrate 1. An inductor L1 in FIG. 1 comprises a spiral inductor electrode layer 7 formed on the top surface and a spiral inductor electrode layer 8 formed on the bottom surface, which layers 7 and 8 are interconnected via a through hole 6. Similarly, an inductor L2 in FIG. 1 comprises a spiral inductor electrode layer 10 formed on the top surface and a spiral inductor electrode layer 11 formed on the bottom surface, which layers 10 and 11 are interconnected via a through hole 9. Numbers 12 through 14 indicate lead terminals. Lead terminals 12 and 14 are electrically connected to the capacitor electrode layers 3 and 5, respectively. Lead terminal 13 is electrically connected to a connecting land 16 formed on the bottom surface and electrically connected to a through hole 15.

However, where the electrode layers 2, 3, 4, 5, 7, 8, 10 and 11 are formed simply to provide the circuit construction of FIG. 1, it has been practically difficult to realize filter characteristics as designed. This is because floating capacity due to the relative dielectric constant of dielectric substrate 1 affects the filter characteristics.

Where the dielectric layer 1 is formed of ceramics or the like having a high relative dielectric constant, the capacity may readily be obtained by adjusting areas of the capacitor electrode layers 2-5. With the inductors provided by the inductor electrode layers 7, 8, 10 and 11, the floating capacity is caused by the relative dielectric constant of dielectric substrate 1, and the floating capacity and the inductors per se constitute an LC resonance circuit. This resonance circuit deteriorates attenuation characteristics of the LC filter.

Particularly where the dielectric substrate 1 has reduced dimensions for compactness of the filter, spacing between adjacent electrode layers is reduced thereby increasing the floating capacity. As a result, the filter characteristics deteriorate to a greater degree.

FIG. 4 shows attenuation-frequency characteristics of the LC filter formed with the electrode layers as in FIGS. 2 and 3. It will be seen from FIG. 4 that only minor attenuation occurs in a high frequency range with respect to the passband of this bandpass filter. This filter is thus not fit for practical use.

SUMMARY OF THE INVENTION

The object of the present invention, therefore, is to provide an LC filter employing a dielectric substrate, which has improved attenuation characteristics in the high frequency range.

The above object is fulfilled, according to the present invention, by an LC filter comprising a dielectric substrate, at least one pair of capacitor electrode layers formed on a top surface and a bottom surface, respectively, of the dielectric substrate at opposite positions across the dielectric substrate, at least one inductor electrode layer formed on at least one surface of the dielectric substrate for constituting an LC circuit with the capacitor electrode layers, and a line electrode formed on one surface of the dielectric substrate to extend from one of the electrode layers along outer edges of other electrode layers, whereby an LC distributed constant circuit is formed to increase attenuation in a high frequency range with respect to a passband.

In a preferred embodiment of the invention, the line electrode extends along outer edges of both the capacitor electrode layer and the inductor electrode layer.

The line electrode may extend linearly.

The inductor electrode layer may comprise a printed coil in spiral form.

Further, the LC filter may be expressed in an equivalent circuit including a parallel circuit of a capacitor and an inductor connected between an input terminal and a grounding terminal, and a series circuit of a capacitor and an inductor connected between the input terminal and an output terminal. In this case, the line electrode comprises LC series elements inserted between the grounding terminal and an intermediate connecting point in the series circuit of the capacitor and the inductor.

In order to reduce the influence of the floating capacity due to the relative dielectric constant of the substrate, LC series elements may be provided as shown in FIG. 5, which consist of a capacitor Ca and an inductor La. The capacitor may be secured by the floating capacity utilizing the dielectric substrate, whereas the inductor having a desired value may be obtained by selecting an electrode length. Based on this concept, the present invention provides the capacitor Ca and inductor La as shown in the circuit diagram of FIG. 5 by forming a line electrode on the dielectric substrate.

According to the present invention, the line electrode is formed on one surface of the dielectric substrate and extends from one electrode layer along and adjacent outer edges of other electrode layers. Consequently, this line electrode and the dielectric substrate provide LC series elements for producing an attenuation pole. Attenuation may thus be increased in the high frequency range with respect to the passband by suitably selecting the size and position of the line electrode. In this way the present invention has realized an LC filter having excellent filter characteristics.

The line electrode is formed on only one surface of the dielectric substrate according to the present invention. This feature provides a further advantage of involving no substantial increase in the material and manufacturing process compared with the known LC filter employing a dielectric substrate.

BRIEF DESCRIPTION OF THE DRAWINGS

These and other objects, advantages and features of the invention will become apparent from the following description thereof taken in conjunction with the accompanying drawings which illustrate a specific embodiment of the invention. In the drawings

DESCRIPTION OF THE PREFERRED EMBODIMENT

Figure 1:
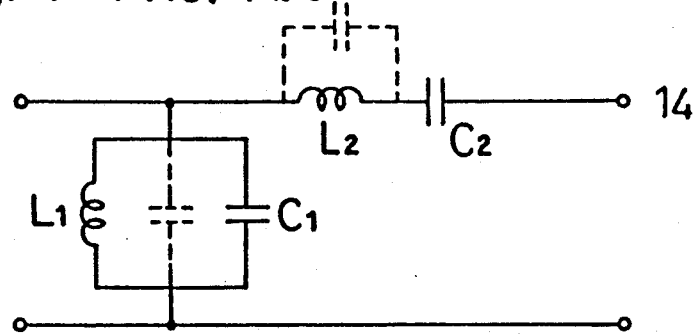
FIG. 1 is a circuit diagram of a known LC filter.
Figure 2:
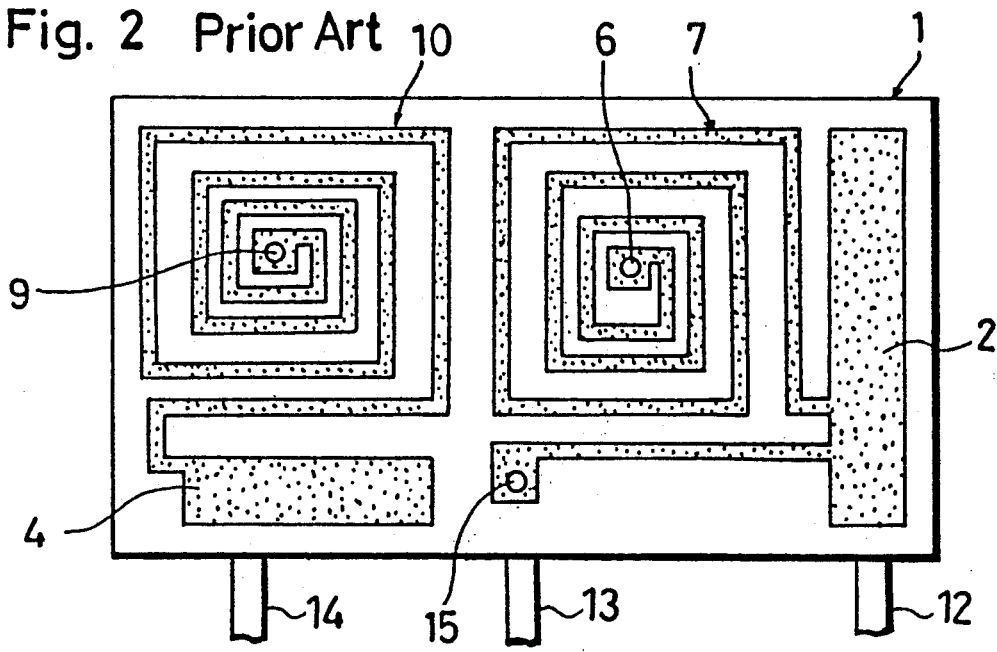
FIG. 2 is a top plan view of the known LC filter.
Figure 3:
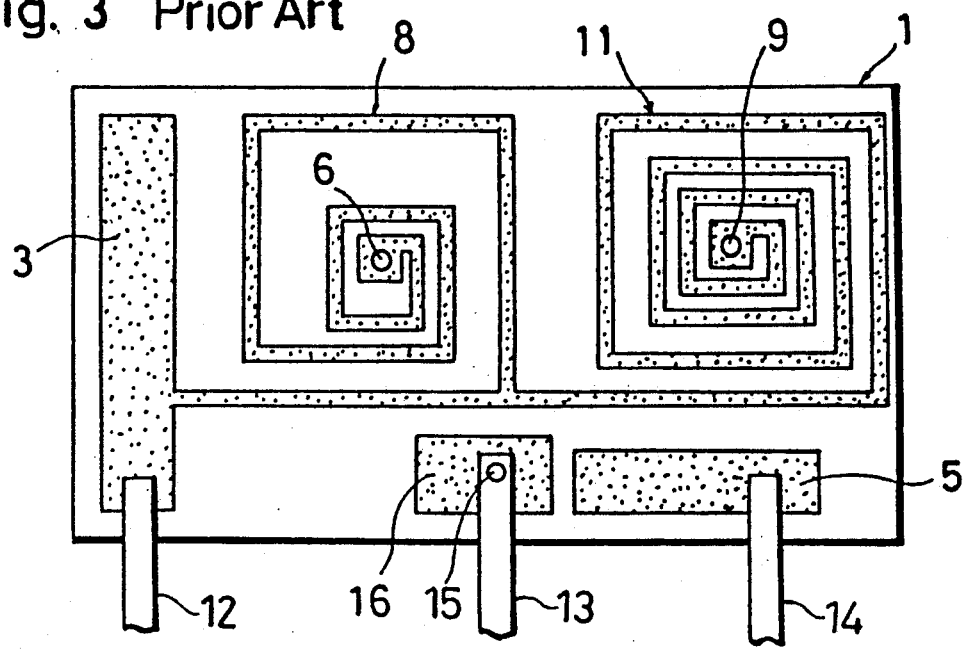
FIG. 3 is a bottom view of the known LC filter.
Figure 6:
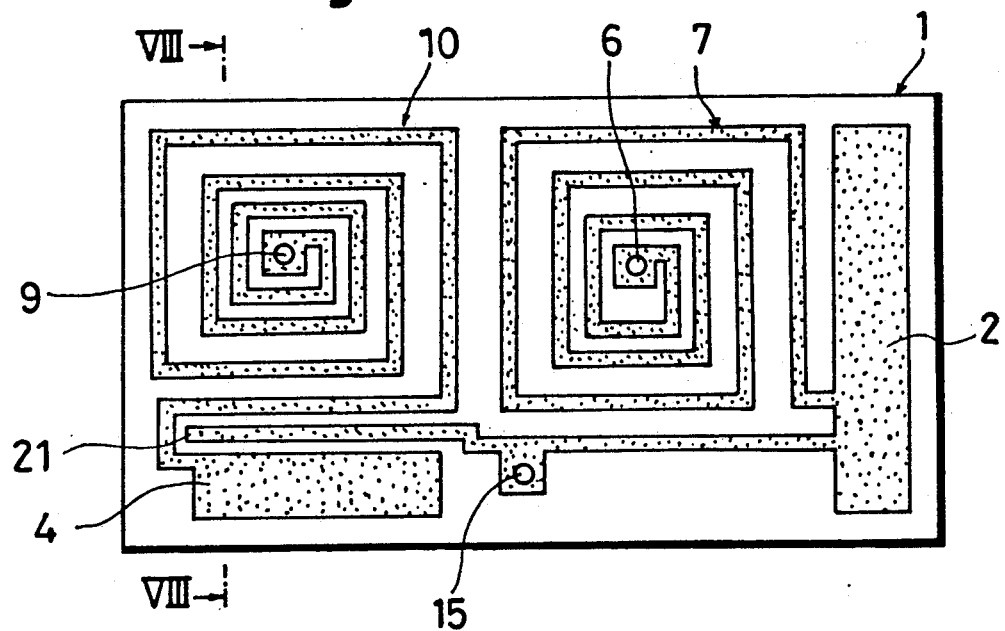
FIG. 6 is a top plan view of an LC filter according to the present invention.
Figure 7:
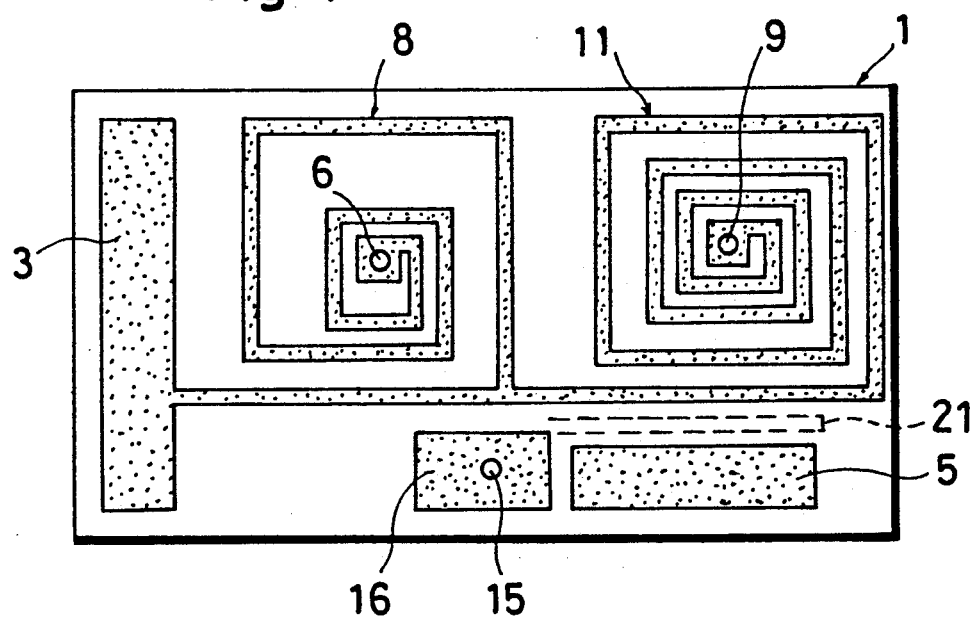
FIG. 7 is a bottom view of the LC filter shown in FIG. 6.
Figure 8:
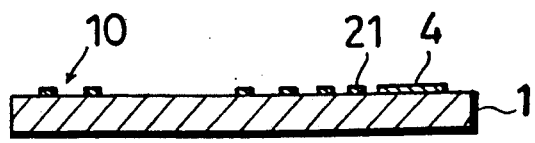
FIG. 8 is a section taken on line VIII—VIII of FIG. 6 showing only layers formed on a top surface of the LC filter.

FIGS. 6 and 7 show top and bottom surfaces of an embodiment of the present invention. This bandpass filter circuit provides inductors L1 and L2 and capacitors C1 and C2 as in the known example shown in FIGS. 1 and 2.

Figure 5:
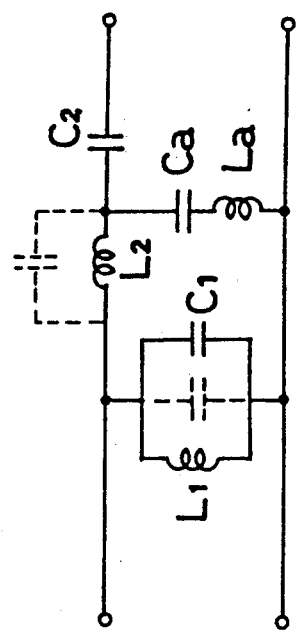
FIG. 5 is a circuit diagram illustrating the present invention.

More particularly, the capacitor C1 comprises capacitor electrode layers 2 and 3 formed on top and bottom surfaces of a dielectric substrate 1 at directly opposite positions across the substrate 1. Similarly, the capacitor C2 comprises capacitor electrode layers 4 and 5 formed at directly opposite positions across the substrate 1. The inductor L1 comprises a spiral inductor electrode layer 7 formed on the top surface and a spiral inductor electrode layer 8 formed on the bottom surface, which layers 7 and 8 are interconnected via a through hole 6. Similarly, the inductor L2 comprises a spiral inductor electrode layer 10 formed on the top surface and a spiral inductor electrode layer 11 formed on the bottom surface, which layers 10 and 11 are interconnected via a through hole 9. As distinct from the construction shown in FIGS. 1 and 2, the LC filter of FIGS. 6 and 7 includes, on the top surface of dielectric substrate 1, an electrode layer 16 electrically connected to a through hole 15, and a line electrode 21 extending in the form of a straight line from the electrode layer 16 along and adjacent outer edges of the capacitor electrode layer 4 and the inductor electrode layer 10. This line electrode 21 provides LC serial elements consisting of an inductor La and a capacitor Ca in an equivalent circuit as shown in FIG. 5. The position and size of line electrode 21 are selected as appropriate, whereby an attenuation pole is produced by the LC serial elements in the high frequency range with respect to the passband of the bandpass filter.

Figure 4:
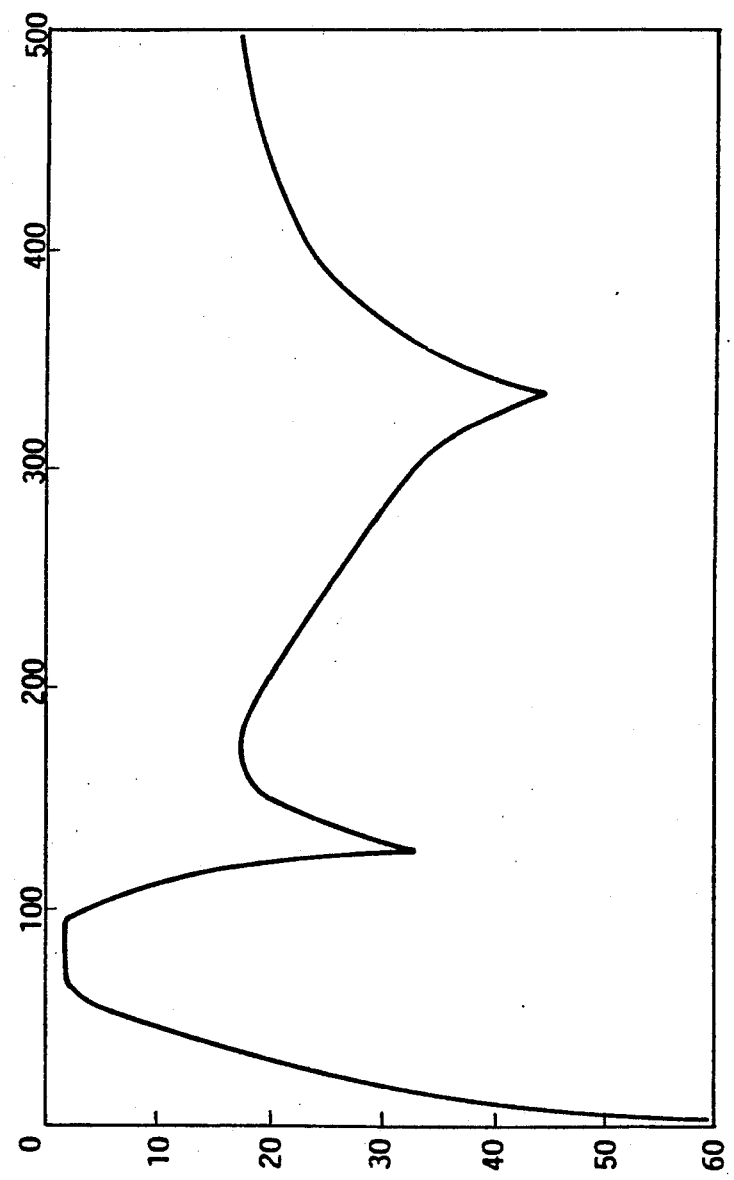
FIG. 4 is a graph showing attenuation-frequency characteristics of the known LC filter.
Figure 9:
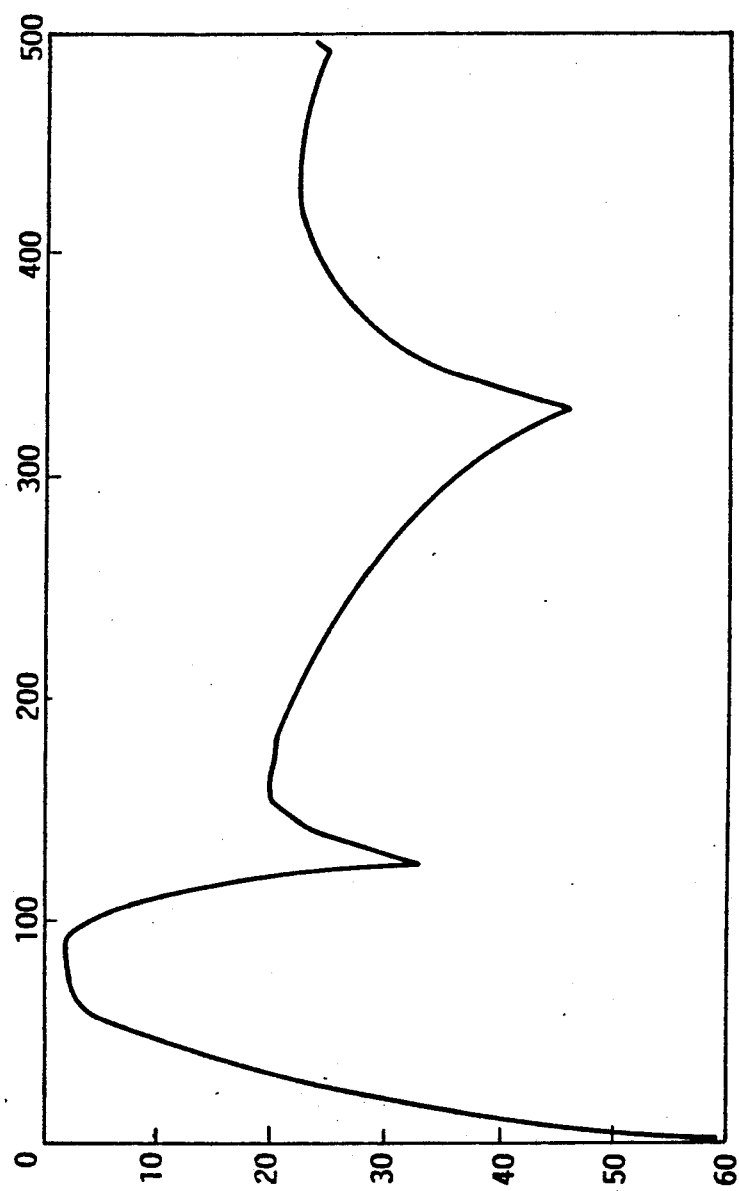
FIG. 9 is a graph showing attenuation-frequency characteristics of the LC filter shown in FIG. 6.

In this embodiment, the line electrode 21 formed as above causes an attenuation pole due to the LC serial elements in the high frequency range with respect to the passband. Consequently, as shown in FIG. 9, the attenuation in the high frequency range is about 10 dB higher than in the prior art (characteristics shown in FIG. 4).

It should be noted that the position of line electrode 21 is not limited to that shown in FIG. 6 as long as the line electrode 21 is positioned to cause the LC serial elements in FIG. 5 to provide a distributed constant. That is, the line electrode 21 need not necessarily extend along the outer edges of both the capacitor electrode layer 4 and the inductor electrode layer 10, and need not be in the form of a straight line as illustrated. The line electrode may be in a curved shape or in the shape of letter L depending on the outer edges of electrode layers along which the line electrode extends. Though not shown in FIGS. 6 and 7, this embodiment includes lead terminals similar to those shown in FIGS. 1 and 2.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. An LC filter having a capacitor-inductor combination, comprising:

a dielectric substrate;

at least one pair of capacitor electrode layers formed on a top surface and a bottom surface, respectively, of said dielectric substrate at opposite positions across said dielectric substrate;

at least one inductor electrode layer formed on at least one surface of said dielectric substrate for constituting an LC circuit with said capacitor electrode layers; and a line electrode formed on said one surface of said dielectric substrate to extend from an electrode layer along outer edges of one of the capacitor electrode layers and the at least one inductor electrode layer, wherein an attenuation pole is formed to increase attenuation in a high frequency range with respect to a passband.

2. An Lc filter as claimed in claim 1, wherein said line electrode extends linearly.

3. An LC filter as claimed in claim 1, wherein said inductor electrode layer comprises printed coil in spiral form.

4. An LC filter as claimed in claim 1, wherein the capacitor electrode layers and the inductor electrode layer form a parallel circuit of a capacitor and an inductor connected between an input terminal and a grounding terminal, and a series circuit of a capacitor and an inductor connected between the input terminal and an output terminal, said line electrode comprising LC series element inserted between the grounding terminal and an intermediate connecting point in the series circuit of the capacitor and the inductor.

* * * * *